United States Patent [19]

Gardiner

[11] Patent Number: 4,976,995

[45] Date of Patent: Dec. 11, 1990

[54] CONSOLIDATION OF DEPOSITED METAL

[75] Inventor: Robert W. Gardiner, Surrey, England

[73] Assignee: The Secretary of State for Defence in Her Britannic Majesty's Government of the United Kingdom of Great Britain and Northern Ireland, London, England

[21] Appl. No.: 282,334

[22] PCT Filed: Apr. 1, 1987

[86] PCT No.: PCT/GB87/00219

§ 371 Date: Nov. 30, 1988

§ 102(e) Date: Nov. 30, 1988

[87] PCT Pub. No.: WO87/05947

PCT Pub. Date: Oct. 8, 1987

[30] Foreign Application Priority Data

Apr. 2, 1986 [GB] United Kingdom ............... 8608023

[51] Int. Cl.$^5$ ............................................. C23C 16/00
[52] U.S. Cl. .................................... 427/251; 427/360; 118/112; 118/730; 29/125; 29/126; 29/130
[58] Field of Search ............... 118/108, 110, 112, 111, 118/120, 722, 730, 107; 29/124, 125, 130, 126, 121.5, 132; 427/250, 251

[56] References Cited

U.S. PATENT DOCUMENTS

| | | | |
|---|---|---|---|
| 1,796,691 | 3/1931 | Jansen | 118/107 |
| 2,044,778 | 6/1936 | Halstead | 118/108 |
| 2,812,270 | 11/1957 | Alexander | 427/251 |
| 3,362,848 | 3/1964 | Hamilton | 117/106 |
| 3,632,406 | 1/1972 | Clough et al. | 118/722 |
| 4,102,663 | 7/1978 | Jung | 427/193 |
| 4,226,608 | 10/1980 | McKelvey | 65/106 |
| 4,352,230 | 10/1982 | Sukenik | 29/130 |
| 4,810,531 | 3/1989 | Heyes | 427/251 |

FOREIGN PATENT DOCUMENTS

| | | |
|---|---|---|
| 546539 | 4/1956 | Belgium . |
| 446825 | 7/1927 | Fed. Rep. of Germany . |
| 1250608 | 9/1967 | Fed. Rep. of Germany . |
| 1256963 | 12/1967 | Fed. Rep. of Germany . |
| 603756 | of 0000 | United Kingdom . |
| 749646 | 5/1956 | United Kingdom . |
| 793979 | 4/1958 | United Kingdom . |
| 1099944 | 1/1968 | United Kingdom . |
| 1393820 | 5/1975 | United Kingdom . |
| 1521293 | 8/1978 | United Kingdom . |
| 2079324 | 1/1982 | United Kingdom . |

OTHER PUBLICATIONS

Japanese Abstract 60-75570, 4/27/85.

Primary Examiner—Bernard Nozick
Attorney, Agent, or Firm—Nixon & Vanderhye

[57] ABSTRACT

Metal deposition apparatus having at least one roller arranged for consolidation of the deposited metal by rolling thereof in the course of the deposition process, which roller comprises a plurality of sub-rollers of independent movement.

8 Claims, 2 Drawing Sheets

CONSOLIDATION OF DEPOSITED METAL

BACKGROUND OF THE INVENTION

1. Field of the Invention

This invention relates to the technology of metal deposition and to the consolidation, during the process of deposition, of the metal deposited. It relates especially to the production of metal by physical vapour deposition (as hereinafter defined) but has application also to the production of metal by spray deposition.

2. Discussion of Prior Art

Unconventional alloys produced by rapid solidification processing exhibit significant improvements in individual properties over alloys produced by the conventional, ingot metallurgy, routes. Aluminium alloys prepared by rapid solidification are being developed for aerospace applications. Most of the techniques for the manufacture of rapidly solidifed alloys involve the production of powder by atomization or by splat quenching. The production of bulk aluminium alloys prepared by these processes is complicated by the problems of degassing and consolidating the material.

Physical vapour deposition is a process in which an alloy is formed by evaporation of constituents followed by direct condensation from the vapour upon a temperature controlled collector. Physical vapour deposition should not be confused with chemical vapour deposition—the latter being characterised by the production of a deposit through chemical reaction in the vapour phase and such is absent in physical vapour deposition. Physical vapour deposition is an alternative to conventional rapid solidification processing for the synthesis of metastable alloys, in which full advantage can be taken of both the exceptionally effective quench obtained by deposition on an atomic scale and the suitability of bulk condensates for direct conversion to wrought forms.

A process of physical vapour deposition (hereinafter abbreviated to "vapour deposition") is described in depth in the Applicant's prior patent No. GB 1521293, and the current specification does not attempt to provide a description to the same depth save in aspects directly relating to the invention hereinafter disclosed. That prior specification documents the need for a vapour deposited metal to be mechanically worked during the process of deposition for the creation of a suitable microstructure and for the avoidance of porosity. In that document various forms of mechanical working are disclosed, the preferred form being a peening action such as that produced by mechanically driven hammers or flails. However, rolling is also disclosed as a potentially effective alternative. In a vapour deposition process the mechanical working is not required to provide consolidation in the sense that consolidation is required for powder compaction. It is found that in vapour deposition that porosity is caused by surface effects such as shadowing caused mainly by the protuberences that develop on the surface. In a vapour deposition process the degree of mechanical working or consolidation should be sufficient to remove asperities from the surface between each exposure to the vapour flux in order to avoid shadowing, and sufficient also to provide a suitable laminar microstructure. Excessive mechanical working may adversely affect the properties exhibited by the product material.

In spray deposition processes a similar requirement for deposit consolidation can be evident. In spray deposition processes a molten metal or alloy is atomised in an inert atmosphere to give a spray of liquid particles which are directed on to a cooler surface where they impinge, coalesce and solidify. Certain spray deposition processes are applied to the production of thin sheet or a coating layer and in such process consolidation of the deposit is unlikely to be required. Other spray deposition processes involving a high density of spray are effectively self-consolidating by virtue of the impact of sprayed particles. However, there can be advantage in operating a spray deposition process at a spray density less than that which is self consolidating because by doing so the problems of producing sufficient rate of cooling to retain metastable phases are reduced. In such circumstances some means of imposed mechanical consolidation may be required and one prior art process utilising such is that known as simultaneous spray peening. This process utilises a peening produced by projecting peening shot through the spray of metal droplets onto the deposit. Obviously there could be scope for alternative arrangements producing the same in-situ and in-process mechanical working.

SUMMARY OF THE INVENTION

It is an object of the present invention to provide an alternative way of mechanically working metal for consolidation thereof in the courses of deposition thereof. The invention is of particular but not sole relevence to the consolidation of metal deposited upon or in the shape of, a body of revolution such as the rotary drum vapour deposition collector disclosed in the Applicant's prior patent No. GB 2079324. In the context of this specification the term "in the course of deposition" and related terms should not be taken to imply the deposition and mechanical working must occur simultaneously for a given area of deposit as occurs in the prior art simultaneous spray peening process. The term is used to imply that consolidation must take place at least at intervals during the deposition process to enable the deposit to be consolidated on a layer by layer basis. Usually, though not invariably, the consolidation will take place continuously at a site on the deposit outside of that receiving fresh metal at any instant.

The present invention is a metal deposition apparatus adapted for use in a such a vapour deposition process or spray deposition process as requires consolidation of the deposited metal in the course of deposition, having rolling means to effect the consolidation characterised in that the rolling means includes at least one roller comprising a closely packed array of sub rollers disposed along its span and mounted on a common support, the mounting being such that each sub roller is capable of independent displacement in directions traverse to the axis of the roller against the action of a centring bias means. The invention provides rollers which can conform to the surface contours of the deposit across the span of the roller whilst providing sufficient force through each sub-roller to flatten asperities and produce consolidation within the rolled area. In contradistinction a single element roller of any worthwhile span would tend to ride upon the high points of the deposit unless an extreme degree of force was imposed.

The apparatus of the invention may incorporate rollers which are arranged into a gang or gangs, each of at least two rollers, the rollers of a gang being coupled together and arranged in a span transverse to the direction of rolling. The rollers are ganged so as to operate in unison. The direction of rolling is indicated by the track resultant from the rolling. The rollers within one row will preferably be coupled together to form a single gang but the separate rows of rollers may be either coupled to form a multi-row gang or may be operable independently. Preferable the rollers are staggered in their position along the span with respect to the rollers of adjacent rows in an echelon arrangement which provides overlapping but not coincident tracking and coverage.

In order to provide an ability for the rollers to conform to general variations in the thickness of the metal deposit across the span of an individual roller or gang of rollers, where such variations in thickness are likely to be close to or in excess of the maximum degree of variation that can be overcome by the conformity of the sub rollers within any roller, the rollers are preferably mounted each on a gimbal support which permits the roller to pivot along its span. Preferably also, in addition to the provision of gimbals, each roller in a coupled gang is independently mounted such that it can rise or fall with change in deposit thickness independently of the others in the gang.

In a preferred form, the apparatus of the invention is adapted to produce a deposit in the form of a body of revolution, the apparatus incorporating means to rotate that body, wherein the rollers are caused to bear upon said body in use of apparatus such that rotation of the body causes mechanical working of the deposit by means of the rollers at each turn of the body.

In order to maximise the benefit accrued from the ability of each roller to conform to the surface of the deposit and thereby cause uniformity of mechanical working of that deposit the number of sub-rollers for a given roller span should be the maximum possible commensurate with avoidance of physical complexity and with a need for lateral rigidity. Moreover the sub-rollers are preferably held in a close-packed configuration within the roller—that is mounted so that only clearance space is present between juxtaposed edges of their peripheral surfaces. This minimises any ridging effect upon the deposit. In a preferred form of the invention each sub-roller is an annular disc, e.g. of tool steel, and the sub-rollers of each roller are mounted upon a common through-shaft each sub-roller being individually sprung thereon by a respective spring or springs. Preferably the annular discs are a loose fit upon the shaft and the respective spring or springs being of corrugate form are located in the space between shaft and disc, there being also shims which are a close-fit upon the shaft interleaved between each disc to maintain the disposition of discs and springs. The assembly of discs and shims on each roller is held together on the through-shaft between collars upon the shaft. Preferably at least one of the collars is axially movable on the shaft in order to permit compression of the aforementioned assembly.

It has been found that there can be a tendancy for a sub-roller in a second echelon roller to be forced to follow a track left by a preceeding sub-roller in the manner of a tramline. In order to resist this tendency one or more of the sub-rollers may be substantially thicker than the bulk of them in order that it provides resistance to forced deflection of the assembly. Moreover the sub-rollers in the various echelons are arranged such that the thicker sub-rollers do not fall into a track left by a preceeding thick sub-roller but bridges a track or tracks left by the standard width sub-rollers. Each roller could include sub-rollers of more than two widths with the disposition of thicknesses within rollers in the various echelons being different in order to minimise lateral forces at source.

BRIEF DESCRIPTION OF THE DRAWINGS

The accompanying drawings illustrate a specific embodiment of the invention in a form dedicated to the production of metal alloy by vapour deposition. The individual Figures are as follows.

DETAILED DISCUSSIONS OF PREFERRED EMBODIMENTS

The following description of the aforementioned specific embodiment of the invention is confined to those elements of that embodiment pertinent to an understanding of the invention, i.e. the means for producing consolidation of the deposit and other interacting elements. It should be understood that the apparatus of the invention will additionally include other elements known in the context of vapour deposition including a vacuum chamber, evaporation source, collector drive means and collector temperature control means. No invention is claimed herein in respect of those elements alone. A suitable form for these elements is that disclosed in the Applicants prior UK patent No. GB 2079324.

Figure 1:
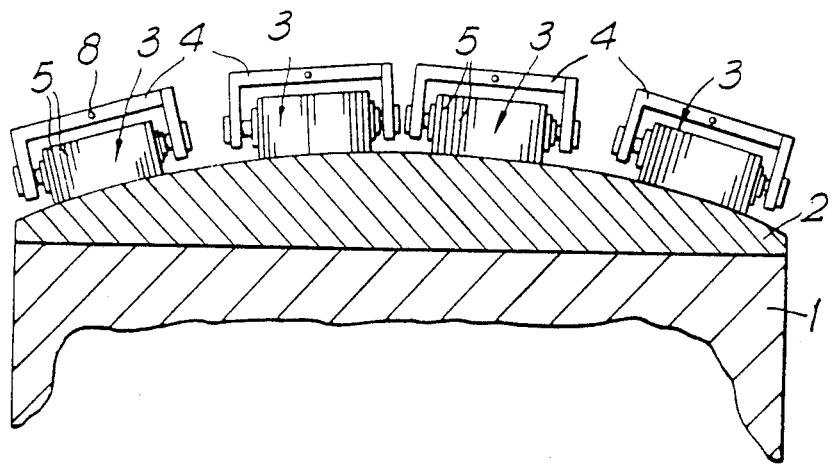
FIG. 1 is a schematic illustration showing a partial lateral view of the apparatus.
Figure 2:
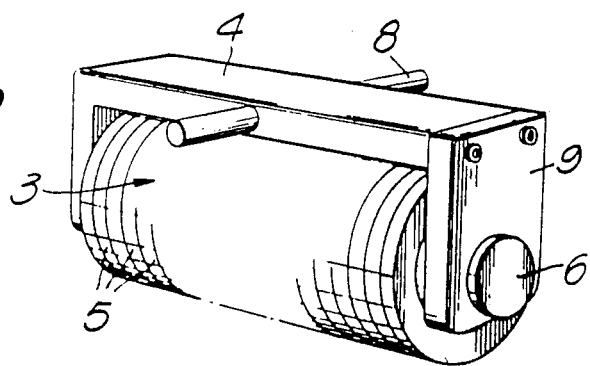
FIG. 2 is an isometric projection showing a roller and part of its mounting.
Figure 5:
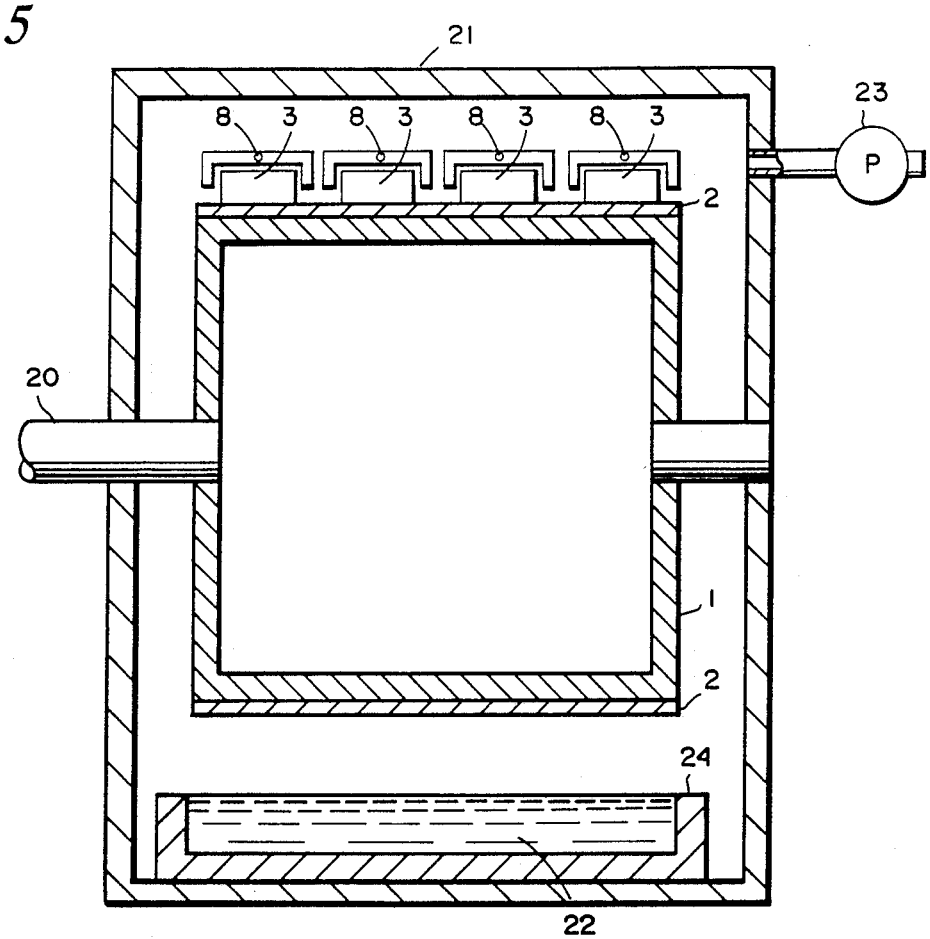
FIG. 5 is a cross sectional view of the vacuum chamber assembly.

In FIGS. 1 and 5 there is shown (partially) a drum collector 1 located in vacuum chamber 21 evacuated by pump 23. This collector is of cylindrical form and in use of the apparatus it is rotated about its axis by drive shaft 20 within a metal vapour flux so that metal 22 from bath 24 is deposited upon its curved surface by condensation from the vapour. A metal deposit is indicated at 2. This deposit 2 will not be of completely uniform thickness across the deposit because the vapour flux is weakened towards its edges by its divergence. The degree of variation in thickness is much exaggerated in FIG. 1 for ease of understanding. A row of four rollers 3 is shown. This row is arranged to span the width of the deposit and is but one row of an echelon configuration intended to provide complete coverage for the deposit at each turn of the collector 1. Each of the rollers 3 comprises a support member 4 and an assembly of sub-rollers 5. In FIG. 2 it may be seen that the support member 4 includes bearings 6—one to each end of the member 4—in which a shaft 7 (which may be seen in FIG. 3) is journalled. The support member 4 is connected to the support structure through a shaft 8 which is journalled in that support structure to provide freedom of movement for the roller in a manner permitting the roller to pivot in accommodation of these general variation in thickness of the deposit which occurs across the span of the roller. There is a detachable end plate 9 to permit mounting of the roller. Each roller 3 is so arranged that it can rise and fall independently of the others to accommodate variations in thickness of the deposit with each passage through the vapour flux. The rollers 3 are biased against the deposit 2 to exert a force commensurate with the span of each roller to provide a sufficient degree of consolidation at each pass of the roller. The bias may be provided by weighting the rollers, by spring means or by pneumatic or hydraulic actuation. It should be borne in mind that all parts of the assembly will be subject to high temperature and must be constructed in materials which tolerate this. The maximum temperature experienced by the metal consolidation means will be dependent upon the design of the overall apparatus and by the temperature within the vapour flux which is different for different alloy systems. The Applicant's specific embodiment is presently used in the production of an aluminium-chromium-iron alloy and the consolidation means is designed to accommodate a maximum temperature of 260° C.

Figure 3:
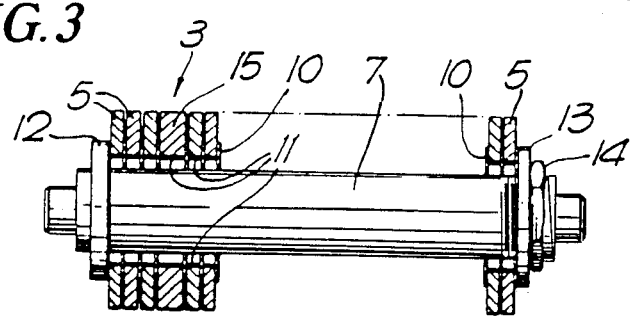
FIG. 3 is a partial lateral view of a roller devoid of mounting.
Figure 4:
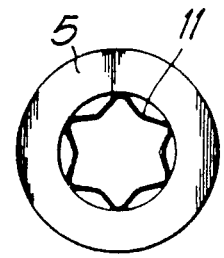
FIG. 4 is a lateral view of an individual sub-roller and its spring.

Greater detail regarding the construction of the rollers may be ascertained from FIGS. 3 and 4. Each roller 3 comprises an assembly of sub-rollers 5 arrayed upon shaft 7 and interleaved thereon by metal shims 10. Sub-rollers 5 are annular discs of tool steel, e.g. of gauge plate, and are machined square at their periphery which surface is diamond polished to a finish of 6 μm. The inner diameter of the disc sub-rollers 5 is sufficiently greater than the diameter of shaft 7 to accommodate a spring 11 therebetween. This spring is of corrugate form and it completely encircles the shaft 7. It functions to provide a centering bias for the sub-roller 5 whilst permitting the latter to move in radial directions. Beryllium-copper or spring steel is preferred as the material for the spring 11. The spring comprises one or more strips of the material made to the corrugate form. More than one strip is used in a concentric configuration when necessary to provide the desired spring rate. The ends of each strip of the spring 11 are overlapped. Each spring 11 is held in place within the inner diameter of its sub-roller 5 by sandwiching between the metal shims 10 which are a sufficiently close-fit upon the shaft 7 to serve this purpose. The assembly of sub-rollers 5, shims 10, springs 11 is located on the shaft 7 between collars 12 and 13. Collar 13 is screwed upon the shaft 7 and adjusted to provide a degree of compression to the aforementioned assembly sufficient to maintain the desired configuration and to impose a degree of lateral rigidity without destroying the radial independence of the sub-rollers 5. A lock nut 14 is provided to fix the position of collar 13. Each roller is mass loaded to provide the required force to produce the mechancial working. A loading of about 5 lb per standard disc per roller is employed. Each roller contains one double thickness disc 15 per roller this being loaded to about 10 lb. The standard discs are of 1.6 mm material and the double thickness discs of 3.2 mm material.

Figure 6:
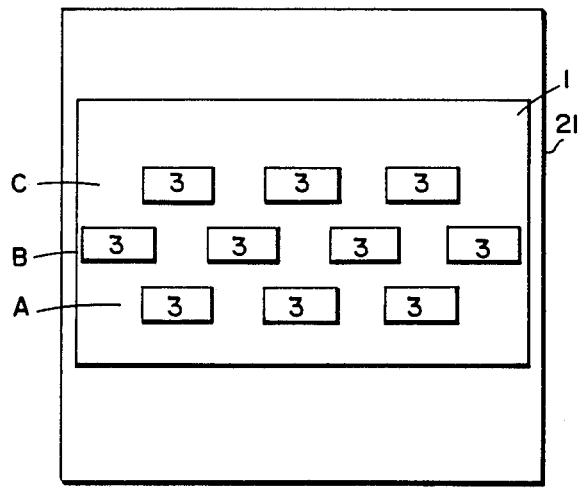
FIG. 6 is a partial plan view of the rollers of one embodiment.

Each of the rollers illustrated by way of the foregoing description is intended to provide, in the context of a vapour deposition process, sufficient surface consolidation of the deposit on a layer by layer basis to create a suitable laminar microstructure and to remove asperities which would otherwise lead to porosity. The radial independence of the sub-rollers provides an assurance of complete coverage over the span of each roller and the echelon arrangement of rows A, B, and C shown in FIG. 6 of ganged rollers provides complete coverage over the span of the deposit. The inclusion of at least one double thickness disc within each roller helps to avoid lateral displacement of discs which could result from tramline tracking.

I claim:

1. A method for producing a metal alloy by evaporation of alloy constituents, collection of evaporated vapours upon a collector by condensation to produce a deposit of the alloy, and consolidating the deposit during the deposition process in order to avoid porosity, all being performed under vacuum, wherein said consolidation step comprises the steps of:
   urging at least one roller against the surface of said deposit on said collector;
   moving one of said rollers and said collector with respect to the other; and
   wherein said at least one roller comprises a close-packed array of narrow, independently-displaceable sub-rollers, so that each sub-roller is capable of accommodating local surface protruberances on said deposit without loss of contact pressure adjacent thereto.

2. A method as claimed in claim 1, in which a spanwise row of said rollers are applied to said deposit surface.

3. A method as claimed in claim 2, in which a plurality of said rollers are applied to a surface of said deposit, wherein said rollers are staggered in position from row to row to provide overlapping coverage of said deposit.

4. In a metal deposition apparatus, for use in a vapour deposition process including a vapour source, a collector upon which said vapour is condensed to yield a deposit, a vacuum chamber enclosing said vapour source and said collector, and means for moving said collector with respect to said vapour source and for producing a spread of said deposit, an improvement comprising at least one roller means, within said vacuum chamber, for consolidating said deposit by rolling in the course of said deposition process, wherein each of said at least one roller means includes at least one roller comprising:
   a support member;
   a shaft having a diameter, said shaft mounted on said support member;
   a plurality of metal discs, each of said discs having a through-bore diameter in excess of said shaft diameter, and said plurality of discs being assembled upon said shaft in a close-packed array; and
   a bias spring means, for each of said discs and positioned within said through-bore, for permitting, against the counter-urging of said bias spring means, radial displacement of said disc with respect to said shaft, independently of said other discs, from an equilibrium position concentric with said shaft.

5. An apparatus as claimed in claim 4, wherein said discs have a thickness in a direction parallel to said shaft and at least one disc has a greater thickness than a majority of said discs.

6. An apparatus as claimed in claim 4, wherein said at least one roller means comprises a plurality of said rollers disposed in a spanwise row with respect to said collector movement.

7. An apparatus as claimed in claim 4, further including at least one gimbal, wherein said at least one roller is mounted by said at least one gimbal, said gimbal comprising means permitting said roller to pivot on an axis transverse to the shaft of said roller.

8. An apparatus as claimed in claim 4, in which said collector is a cylindrical body and said means for moving rotates said collector about an axis of said cylinder, and further comprising at least one row of said rollers for bearing upon said deposit on said collector, such that said collector rotation forces a consolidation of said deposit by the action of said rollers.

* * * * *